United States Patent

Kurata et al.

[11] Patent Number: 5,948,578
[45] Date of Patent: Sep. 7, 1999

[54] PHOTORESIST

[75] Inventors: Tetsuyuki Kurata; Hiroshi Koezuka, both of Hyogo-ken, Japan

[73] Assignee: Mitsubishi Denki Kabushiki Kaisha, Tokyo, Japan

[21] Appl. No.: 07/813,749

[22] Filed: Dec. 30, 1991

[30] Foreign Application Priority Data

Jan. 16, 1991 [JP] Japan ................................. 3-003277

[51] Int. Cl.⁶ ........................................................ G03C 3/00
[52] U.S. Cl. .............................................................. 430/18
[58] Field of Search .............................. 430/18; 428/1; 385/141, 130, 122, 14

[56] References Cited

U.S. PATENT DOCUMENTS 5,045,419  9/1991  Okumura ............................ 430/5
5,131,068  7/1992  Kanarian et al. ................. 385/130
5,142,605  8/1992  Diemeer et al. .................. 385/130

OTHER PUBLICATIONS

"Synthesis of New Metal–Free Diazonium Salts and Their Applications to Mirolithography", Journal of Photopolymer Science and Technology, vol. 2, No. 1 (1989), by Shou–ichi Uchino et al, pp. 59–65, 1989. Abstract Only.
"Deep UV Exposure of $Ag_2Se/GeSe_2$ Utilizing an Excimer Laser", IEEE Electron Device Letters, vol. EDL–5, No. 1, by K.J. Polasko et al, pp. 24–26, 1984.

*Primary Examiner*—S. Rosasco
*Attorney, Agent, or Firm*—McDermott, Will & Emery

[57] ABSTRACT

A photoresist is applied on a substrate and exposed using a reduction optical system. The photoresist is adapted to have a non-linear optical effect in which the light absorption coefficient or the photochemical reaction efficiency changes non-linearly with respect to light intensity, the photoresist reacts to the second harmonic or the tertiary harmonic, or it presents a self convergence effect.

15 Claims, 4 Drawing Sheets

PHOTORESIST

BACKGROUND OF THE INVENTION

1. Field of the Invention

The present invention relates to a photoresist for forming a fine pattern used in manufacturing a large scale integrated circuit (LSI) and so on.

2. Description of the Background Art

FIGS. 3A and 3B are views schematically showing the conventional photolithography technique. Referring to FIG. 3A, a photoresist film 2 is formed by applying a photoresist material onto a substrate 1 such as silicon wafer. A photomask 3 is located between substrate 1 and a light source. A reduction optical system 4 for focusing light from the light source onto photoresist film 2 is provided between photomask 3 and photoresist film 2.

After forming photoresist film 2 on substrate 1 as shown in FIG. 3A, photoresist film 2 is irradiated with the light 5 from the light source through photomask 3 and reduction optical system 4. A predetermined portion of photoresist film 2 is exposed by this irradiation. Thereafter, photoresist film 2 of a reduced pattern according to the pattern of photomask 3 can be formed as shown in FIG. 3B by removing a portion sensitized in a developing process.

Almost parallel rays as shown in FIG. 4A are preferred as the light 5 of the light source used in an exposure process as stated above, in which a spread of diffraction of incident light is small and a beam width of the light does not substantially change in the film thickness of photoresist film 2. In such a case, as far as the light 5 reaches substrate 1, the film thickness of photoresist film 2 does not significantly affect the resolution.

In the existing photolithography process for manufacturing a large scale integrated circuit and so on, however, as reduction optical system 4 is generally used, parallel rays as shown in FIG. 4A cannot be formed. When the light 5 was focused on the surface of or in the vicinity of photoresist film 2 in order to reproduce a mask pattern on the surface of photoresist film 2, the spread of diffraction of incident light was wide as shown in FIG. 3A and the light beam width significantly changed with respect to the film thickness of photoresist film 2.

Such a resolution limitation of the photoresist film can be described as follows.

That is, if the light 5 includes totally parallel rays, passing through photoresist film 2 in parallel, the size of a collected light spot when the parallel rays are collected with an optical system is given as a radius r of Airy Disc and expressed by the following equation, which limits the resolution of the photoresist film:

$$r = (0.61 \times \lambda)/NA.$$

In this case, $\lambda$ represents the wavelength of the light source and, in practice, g rays or i rays of a Hg lamp are used for it. A method is now being considered in which X rays (<100 nm) and so on obtained from an excimer laser (KrF; 248 nm, ArF;196 nm) or an SR are used as a light source in order to form a finer pattern. NA is an aperture of the optical system representing a ratio of an effective diameter to a focal length of an optical lens. The larger the aperture NA is, the smaller the diameter of the collected light spot becomes, so that a higher resolution can be expected. However, if the aperture NA becomes larger, the spread of light becomes wide in front of and behind the focal point, causing the depth of focal point to be smaller, so that various problems are caused for sensitizing a thick photoresist film. A maximum of 0.6, normally in the order of 0.45 is taken as a value of the aperture NA when it is used for projection onto a photoresist film in manufacturing an LSI and so on.

A description will now be made of a practical example. A film thickness in the order of 1 $\mu$m is required for a typical monolayer photoresist film 2 while it is desired that an excimer laser (for example, KrF; 248 nm) expected as a light source for hyperfine treating should realize a resolution of line and space of 0.35 $\mu$m to 0.25 $\mu$m. According to the equation above, the aperture NA of the optical system in this case needs to be 0.44–0.61. In this case, the light beam for photoresist film 2 having a thickness in the order of 1 $\mu$m is as shown in FIGS. 3A and 3B and if the focus is placed at the surface of photoresist film 2, the light beam spreads to 0.44–0.61 $\mu$m at the boundary with the substrate. Accordingly, it is not possible to obtain a shape of pattern for line and space of a desired resolution. Then, if the aperture NA of the optical system is 0.4, the diameter of the light beam hardly spreads even at the boundary of photoresist film 2 with substrate 1, allowing a state of almost parallel rays as shown in FIGS. 4A and 4B. As a result, though a desired form of pattern can be obtained, the diameter of the collected light spot becomes large, i.e., 0.38 $\mu$m, inevitably decreasing the resolution. It is reported in K. J. Polasko et al., IEEE, Electro. Dev. Lett. EDL-5, 1, p.24 (1984) that the sensitivity is increased when a photoresist is exposed by direct exposure using an excimer laser (KrF; 249 nm) and then the pulse power of the laser is increased.

As stated above, it can be seen that there is a trade-off relationship between a spot diameter of diffraction limitation and a depth of focal point with the wavelength of the light source being constant. That is, in patterning a thick photoresist film 2 by exposure, if an optical system is employed having an aperture ratio NA which is just enough for ensuring such a depth of focal point that the light 5 includes rays parallel to each other to some extent within photoresist film 2, the resolution must be sacrificed. If an optical system of a high aperture ratio NA is employed, the light 5 spreads inside photoresist film 2, so that a problem such as side etching is caused at the time of development, making it difficult to obtain a preferable pattern. At the moment, though a shorter wavelength of a light source and a higher aperture ratio of an optical system are adopted in order to increase integration density of very large scale integrated circuits, a thickness of photoresist film 2 can hardly be changed from that of the conventional ones due to the need for ensuring dry etching resistant characteristic and so on, so that it is still difficult to obtain a patterning film of a photoresist having a high aspect ratio and a high resolution.

Methods in which a photoresist film is used in a structure of combination of two or more layers have been developed for obtaining a photoresist film 2 of a required thickness by a post-treatment of lithography while raising such a resolution close to the diffraction limitation of the light. One of them is a method using a double-layered structure, in which a very thin photoresist film is formed on a thick film having no dry etching resistant characteristic. In this case, it is possible to collect light with an optical system of a high NA without considering a spread of diffraction of the directed light since the photoresist film is thin. Thereafter, a resist pattern form having a required thickness can be obtained with a high resolution by etching, using the thin photoresist layer as a mask in accordance with a method such as dry etching or the like.

Another method is CEL (Contrast Enhanced Lithography) in which a contrast enhancement layer is applied onto photoresist film 2. Since such a contrast enhancement layer strongly absorbs light used for exposure and discolors to pass the light, the contrast can be increased if the photoresist film is sensitized through the CEL layer.

Synthesizing of a material used for CEL is disclosed in Shou-ichi Uchino et al., J. Photopolymer Sci. Tech. 2, 1, p. 59–65 (1989) in which a resolution of a resist can be enhanced by improving the contrast of an optical image reduced by a reduction projection exposure device.

However, formation of such a photoresist film having the double-layered structure causes a problem of an increase in the number of manufacturing processes, which is significantly disadvantageous in manufacturing large scale integrated circuits of increased integration density.

Another one is a phase shifting method for forming a photoresist film having a required thickness with a high resolution. Since this method is intended for enhancement of the contrast by inversion of light phase for forming adjacent patterns with a phase shifting layer provided for a mask, manufacturing of the mask becomes complicated and it can only be employed for forming a pattern having the line and space periodically repeated.

SUMMARY OF THE INVENTION

An object of the present invention is to provide a photoresist by which a favorable resist pattern having a high resolution can be formed even if a reduction optical system of a high aperture is employed.

A photoresist in accordance with the present invention is adapted to have non-linear optical effects.

In accordance with a photoresist according to the present invention, a spread of diffraction of light within a photoresist film can be effectively reduced by non-linear optical effects and a pattern of a high resolution can be formed.

In accordance with the present invention, it is possible to effectively prevent side etching of a photoresist due to a spread of diffraction of a light beam within a photoresist film, so that a resolution close to a diffraction limitation of incident light for exposure be realized and a resist film of a required thickness can be formed in a process after lithography.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A description will now be made of one embodiment of the present invention in the following. Though a positive type photoresist is described below, a negative type photoresist can also be applied in the same way.

EXAMPLE 1

Figure 1A:
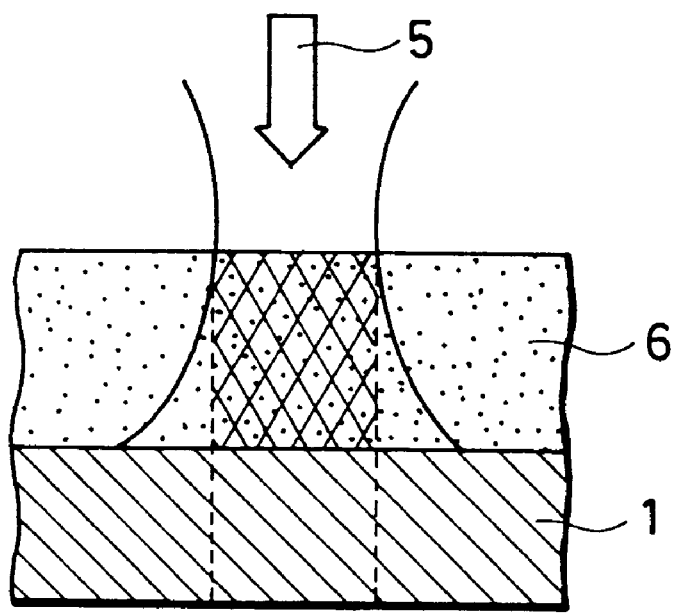
FIG. 1A is a cross-sectional view showing a state where a photoresist according to the present invention is exposed.
Figure 1B:
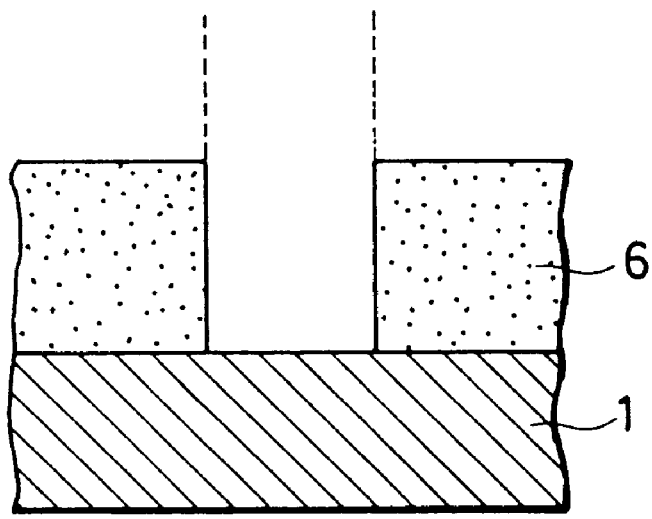
FIG. 1B is a cross-sectional view showing a state after removing an exposed portion of the photoresist in accordance with the present invention.
Figure 2:
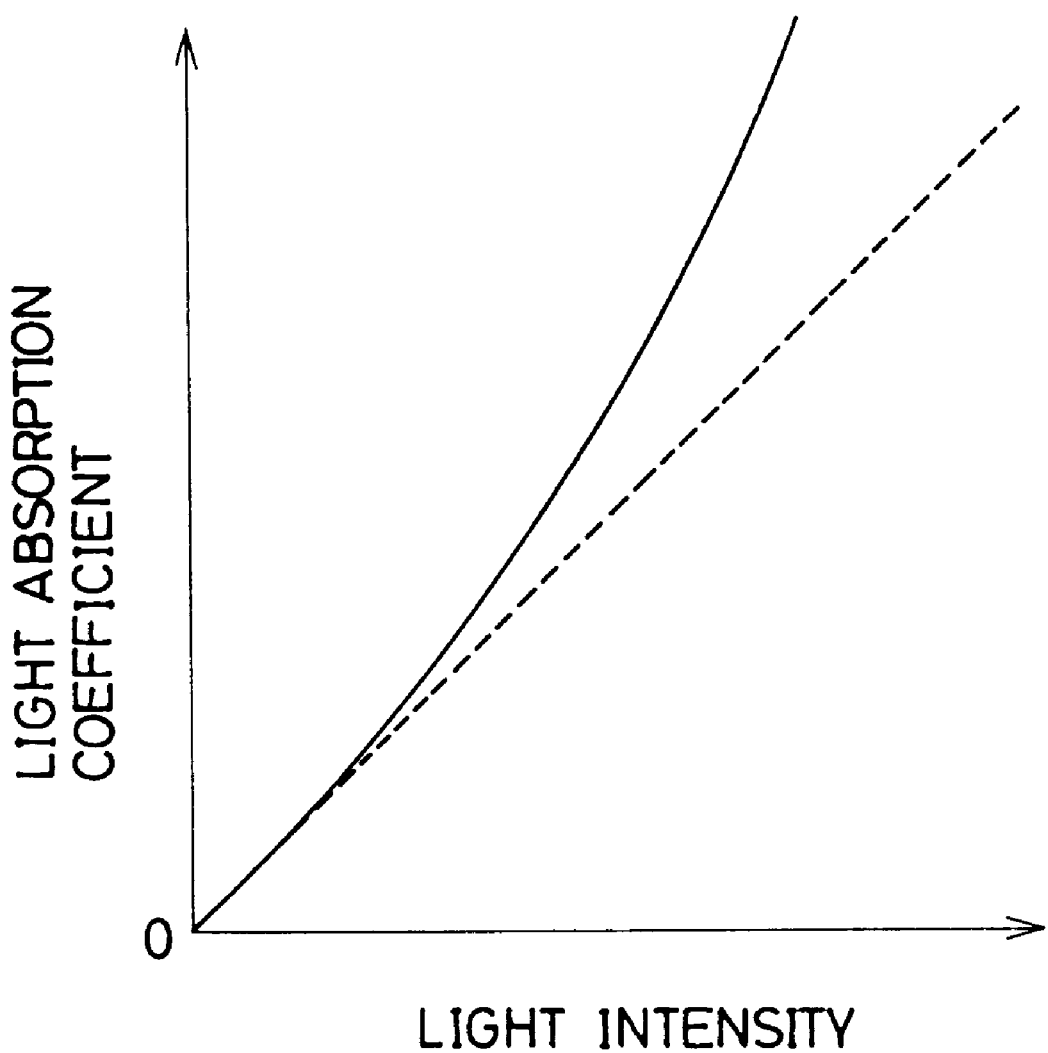
FIG. 2 is a diagram showing a non-linear characteristic of a photoresist in accordance with one embodiment of the present invention.
Figure 3A:
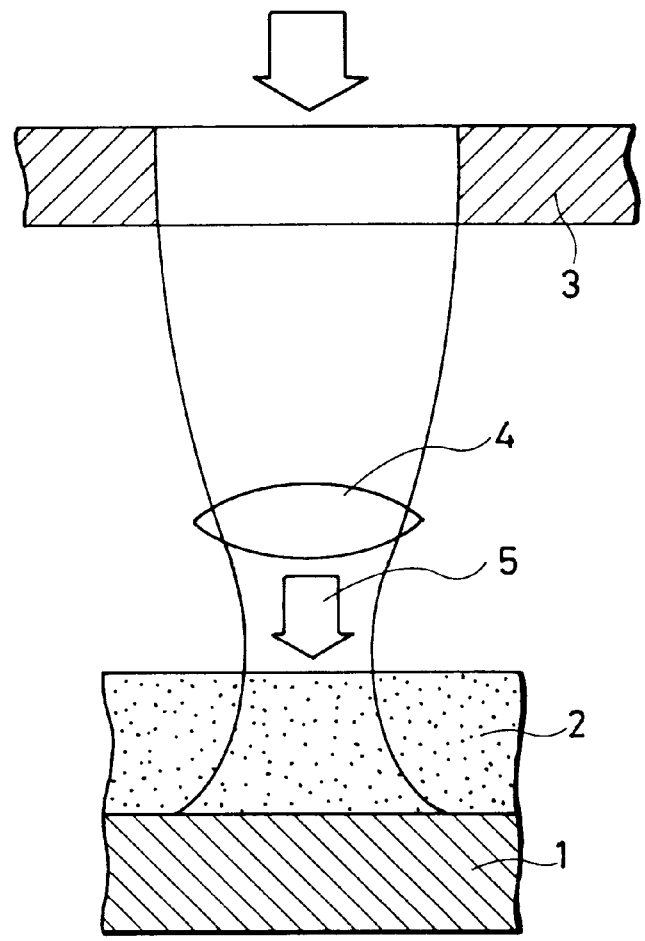
FIG. 3A is a cross-sectional view showing a state where a conventional photoresist is exposed.
Figure 3B:
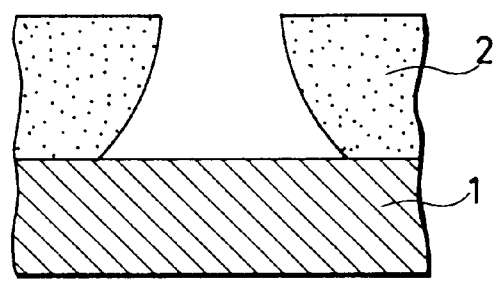
FIG. 3B is a cross-sectional view showing a state after removing an exposed portion of the conventional photoresist.
Figure 4A:
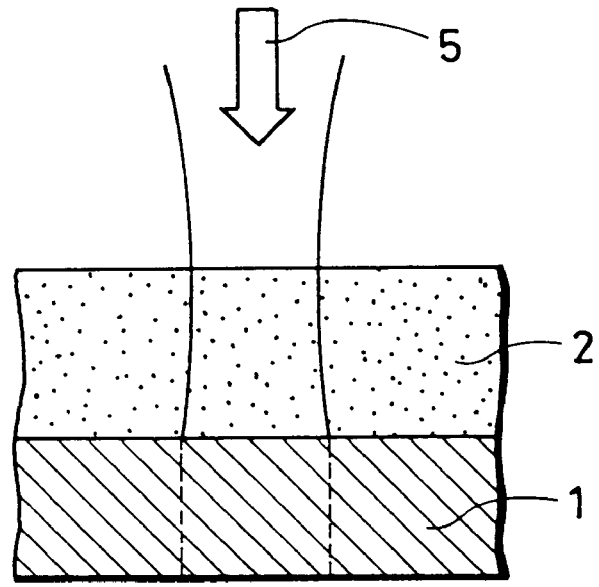
FIG. 4A is a cross-sectional view showing a state where the conventional photoresist is exposed to parallel rays.
Figure 4B:
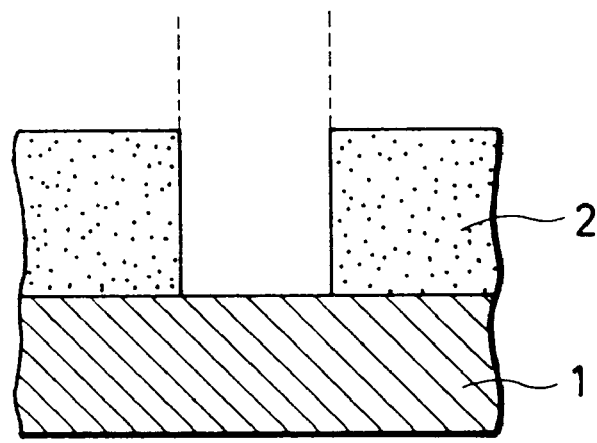
FIG. 4B is a cross-sectional view showing a state after removing a portion of the conventional photoresist exposed to the parallel rays.

In FIG. 1, 6 represents a photoresist film applied on a substrate 1 and is formed of a photoresist material having a non-linear optical effect in which a light absorption coefficient increases non-linearly in accordance with intensity of the light as shown in FIG. 2. When light 5 for exposure which passed through a photomask is focused on the surface of photoresist film 6 up to a diffraction limitation by a reduction optical system having a high aperture NA, the collected light 5 spreads within photoresist film 6 as shown in the figure. At this time, the non-linear optical effect emerges within photoresist film 6, enabling optical reaction at the central portion of photoresist film 6 to proceed more rapidly than the distribution of light intensity, so that it is possible to sensitize only the central portion of photoresist film 6.

It is also possible to sensitize only a central portion of a photoresist film in a case where a photoresist material has such a non-linear optical characteristic that an optical reaction efficiency is non-linearly increased with respect to the light intensity even if the light absorption coefficient of the photoresist material changes linearly.

EXAMPLE 2

A material which causes a second harmonic generation (SHG) phenomenon, for example, can be employed as a resist material having the non-linear optical effect. The second harmonic generation phenomenon is a phenomenon where the wavelength of incident light is output while being halved, and the intensity of output light then is proportional to the square of the intensity of the incident light, so that the second harmonic generation is caused efficiently in a portion close to the center of the light beam. Accordingly, if the photochemical reaction of the photoresist material is photosensitive to the second harmonic rather than the irradiating light, the photochemical reaction proceeds well in the portion close to the center in photoresist film 6, preventing side etching at the time of development. As a possible photoresist material having such a secondary non-linear optical effect, there may be considered various kinds of compounds with a structure including a functional group having the non-linear optical effect, for example, a substituted compound such as nitroaniline, azobenzene, hemicyanine coloring matter, merocyanine coloring matter, nitrostilbene, and nitropyridine.

EXAMPLE 3

A photoresist causing a tertiary harmonic generation phenomenon as the non-linear optical effect can lead to the same effects. That is, since the intensity of the tertiary harmonic is proportional to the cube of the incident light intensity, the tertiary harmonic is efficiently caused in a portion close to the center of the light beam, and if photoresist film 6 has photosensitivity to the wavelength of the tertiary harmonic, a photochemical reaction proceeds well in the portion close to the center of photoresist film 6, making it possible to prevent side etching.

EXAMPLE 4

Furthermore, it is also possible to apply a self focusing effect as the non-linear optical effect. If a photoresist material has a tertiary non-linear optical effect, the index of refraction is changed according to the incident light intensity. In a case of a material whose index of refraction is increased as the incident light intensity becomes larger, since the higher the light intensity is, the larger the index of refraction becomes, a self focusing effect emerges in which a normal light beam having a high light intensity at the center focuses into a thin beam by itself. In this way, the occurrence of the self focusing effect within photoresist film 6 makes it possible to control the spread of the light beam within photoresist film 6, so that a desired resist pattern of a high resolution can be formed using a reduction optical system of a high aperture NA.

As a possible photoresist material causing the tertiary harmonic generation phenomenon or the self focusing effect, there may be considered various kinds of compounds with a structure including a functional group having the non-linear optical effect, for example, one including an unsaturated conjugated bond such as an acetylenic linkage or a diacetylenic linkage in the skeleton of polymer, or one including a heterocyclic five-membered ring such as thiophene or pyrrole in the skeleton or the side chain.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An exposed photoresist, said exposed photoresist having been formed by (a) applying on a substrate a photoresist having a non-linear optical property which increases with respect to increasing light intensity, and (b) exposing the photoresist using a reduction optical system with a mask.

2. The exposed photoresist according to claim 1, wherein the non-linear optical property comprises a light absorption coefficient which increases non-linearly with respect to the increasing light intensity.

3. The exposed photoresist according to claim 1, wherein the non-linear optical property comprises a photochemical reaction efficiency which increases non-linearly with respect to the increasing light intensity.

4. The exposed photoresist according to claim 1, wherein the non-linear optical effect comprises the second harmonic which is generated in the photoresist to an exposure light and the photoresist reacts with the second harmonic.

5. The exposed photoresist according to claim 4, wherein the photoresist includes a functional group selected from the group consisting of nitroaniline, azobenzene, hemicyanine coloring matter, merocyanine coloring matter, nitrostilbene, nitropyridine, and substituted compounds thereof.

6. The exposed photoresist according to claim 1, wherein the non-linear optical property comprises the tertiary harmonic which is generated in the photoresist to an exposure light and the photoresist reacts with the tertiary harmonic.

7. The exposed photoresist according to claim 6, wherein the photoresist includes an unsaturated conjugated bond in the skeleton of a polymer.

8. The exposed photoresist according to claim 6, wherein the photoresist includes a heterocyclic five-membered ring at least in either of the skeleton or the said chain of a polymer.

9. The exposed photoresist according to claim 1, wherein said non-linear optical property is a self-focusing property in which the index of refraction of the photoresist changes non-linearly with respect to the light intensity, so that a light beam is focused to be thin.

10. The exposed photoresist according to claim 9, wherein the photoresist includes an unsaturated conjugated bond in the skeleton of a polymer.

11. The exposed photoresist according to claim 9, wherein the photoresist includes a heterocyclic five-membered ring at least in either of the skeleton or the side chain of a polymer.

12. The exposed photoresist according to claim 1, wherein the photoresist is of a positive type.

13. The exposed photoresist according to claim 1, wherein the photoresist is of a negative type.

14. The exposed photoresist according to claim 1, wherein the exposed photoresist has a thickness of 1 $\mu$m.

15. The exposed photoresist according to claim 1, wherein a pattern on the photoresist has a line and space resolution of 0.25 $\mu$m to 0.35 $\mu$m.

* * * * *